United States Patent [19]

Viola

[11] Patent Number: 4,621,040

[45] Date of Patent: Nov. 4, 1986

[54] IMAGING ELEMENT AND PROCESS WITH LASER ABSORPTIVE INK BARRIER LAYER

[75] Inventor: Michael S. Viola, Burlington, Mass.

[73] Assignee: Polaroid Corporation, Cambridge, Mass.

[21] Appl. No.: 789,666

[22] Filed: Oct. 21, 1985

[51] Int. Cl.$^4$ .......................... G03C 1/72; G03C 5/00
[52] U.S. Cl. .................................. 430/138; 430/200; 430/292; 430/945
[58] Field of Search ............... 430/138, 211, 200, 292, 430/945

[56] References Cited

U.S. PATENT DOCUMENTS

| 3,255,002 | 6/1966 | Rogers | 430/211 |
| 4,399,209 | 8/1983 | Sanders et al. | 430/138 |
| 4,440,846 | 4/1984 | Sanders et al. | 430/138 |
| 4,489,151 | 12/1984 | Sanders et al. | 430/138 |

FOREIGN PATENT DOCUMENTS 2113860 10/1983 United Kingdom .

*Primary Examiner*—Richard L. Schilling

[57] ABSTRACT

A method for forming an image which comprises imagewise exposing an imaging element with a laser, said imaging element comprising a support carrying on a first surface, in sequence, a layer of microcapsules containing an ink, and a laser-absorptive, ink barrier layer; superposing an imaging-receiving layer adapted to receive ink from said microcapsules over said imaging element and rupturing said microcapsules; whereby ink from said microcapsules in the exposed areas of the imaging element diffuses to said superposed receiving layer forming an image corresponding to the laser exposure.

31 Claims, 2 Drawing Figures

IMAGING ELEMENT AND PROCESS WITH LASER ABSORPTIVE INK BARRIER LAYER

BACKGROUND OF THE INVENTION

Recording systems are known in the art wherein a source of radiant energy, such as a high energy beam, is directed to a recording medium and which results in liberation of chemicals such as a dye or dye former in the recording material. The image is thus-formed either in the imaging material at the locations where the imagewise exposure has occurred or in an associated image-receiving layer. A preferred source of exposing radiation is a laser. The use of a laser beam provides a high degree of resolution to the image recorded in the imaging material.

It is known in the art to employ microcapsules which contain a chromogenic material. These microcapsules are responsive to the exposing radiation and, as a function of the exposure, selectively retain or release the chromogenic materials. That is, the methods generally either involve a retention of the chromogenic material as a result of a hardening of the capsules or a material which immobilizes the chromogenic material, or a release of the chromogenic material by a bursting of the capsules upon exposure.

U.S. Pat. No. 4,399,209 issued Aug. 16, 1973 is directed to a transfer imaging system which comprises a layer of microcapsules wherein a chromogenic material is encapsulated with a photosensitive composition. The photosensitive composition comprises a radiation-curable composition which upon exposure causes an increase in its viscosity thereby preventing diffusion of the chromogenic material upon rupture of the capsule. Upon rupture of the capsules, those capsules in which the radiation-curable material was not activated will release the chromogenic material which will transfer to a developer sheet and react with the developer material to form the image. Similar imaging systems are described in U.S. Pat. Nos. 4,440,846 and 4,489,151. A color imaging system employing the aforementioned photosensitive composition encapsulated in pressure-rupturable microcapsules is described in British Pat. No. 2,113,860 published Aug. 10, 1983.

SUMMARY OF THE INVENTION

The present invention is directed to a method for forming an image and an imaging element for use in said method. The method comprises an imagewise exposure of an imaging element with a laser wherein the imaging element comprises a support carrying on a first surface, in sequence, a layer of microcapsules containing an ink and a laser-absorptive, ink barrier layer; superposing an image-receiving layer adapted to receive ink from said microcapsules over said imaging element and repturing said microcapsules whereby ink from said microcapsules in the exposed areas of said barrier layer diffuses to said superposed receiving layer forming an image corresponding to the laser exposure.

DETAILED DESCRIPTION OF THE INVENTION

Figure 1:
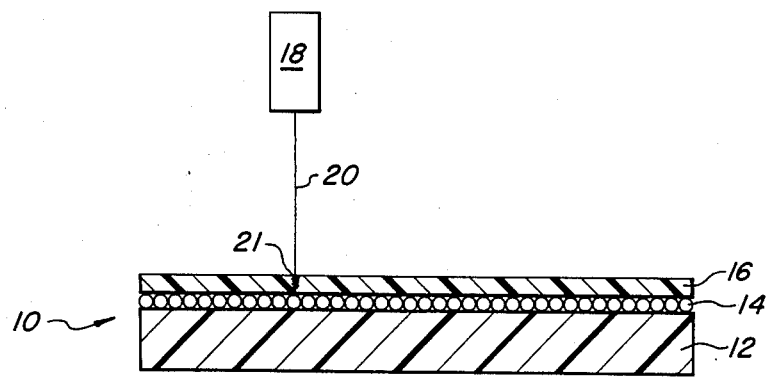
FIG. 1 is a cross-sectional view of the imaging element of the present invention in the exposure mode.

The use of a laser beam in imaging systems is particularly desirable in the art due to the high resolution that can be achieved with the laser beam. In addition, the electro-optical equipment exists to scan an image and transmit it into continuous or discontinuous emissions from a laser source.

The present invention is directed to an imaging method and to an imaging element for use in a laser imaging system. The imaging element employed in the present invention comprises a support carrying on a first surface, in sequence, a layer of microcapsules containing an ink and a laser-absorptive, ink barrier layer overlying the layer of capsules. The imaging element is given an imagewise exposure with a laser. Subsequent to the exposure, an image-receiving element is superposed over the imaging element next adjacent the barrier layer and the microcapsules are ruptured, preferably by passing the superposed image-receiving element and imaging element through a set of rollers which provides sufficient force to rupture the capsules and release the ink retained therein. In the areas of the barrier layer that have been exposed to the focussed beam from the laser, the dye released from the ruptured capsules will penetrate through the barrier layer and deposit in the image-receiving layer. The image-receiving element can then be detached from the imaging material.

While rupturing the microcapsules with pressure rollers is the preferred method, it should be understood that other energy-directed means may be employed such as thermal, acoustical and ultrasonic means. Care should be taken to ensure that such rupturing means do not impair the function of the barrier layer.

The microcapsules employed in the present invention may be of any suitable size depending upon the image resolution desired. Thus, the capsules may range from about 1 micrometer to about 100 micrometer, preferably 3–15 micrometer. The composition of the material which forms the capsule walls is not critical. It is only necessary that the material be sufficiently impermeable so that it will retain the ink therein and will not be chemically attacked by or degrade the ink retained therein. Thus, if the ink is non-aqueous, preferably a hydrophilic polymer is employed as the capsule wall. If the ink is aqueous, a water-insoluble material is employed as the microcapsule wall. As examples of suitable materials which may be employed to form the microcapsules, mention may be made of proteins, such as gelatin and collagen; vegetable gums such as gum arabic and sodium alginate; cellulosics such as ethyl cellulose and carboxymethyl cellulose; condensation polymers, such as nylon or polyurethanes; copolymers, such as a crylic acid copolymers and maleic anhydride copolymers with ethylene or vinyl methyl ether; homopolymers, such as polyvinyl chloride or saran; curable polymers such as epoxies and nitroparaffin; and waxes such as beeswax and shellac. The structure of the microcapsule wall, however, must be such that they can be readily ruptured by the application of force to release the ink retained therein.

Methods for producing the microcapsules are well-known to the art and include interfacial polymerization or rapid insolubilization of a polymer; physical chemical methods, such as phase separation techniques and mechanical techniques such as spray drying or air suspension drying. Additional details relating to microcapsules and their preparation can be found in *Microcapsule Processing and Technology,* A. Kondo, Marcel Decker, Inc., New York, NY, 1979.

The term "ink" as used herein is employed in its broadest sense, i.e., a fluid material which is colored or capable of providing a color. Thus, the ink may comprise a solution or suspension of a pigment or dye in a solvent or suspending fluid medium. The fluid medium may be aqueous or non-aqueous. The ink may be composed of any color desired including black.

If an aqueous ink is employed, it is preferred to formulate the liquid vehicle with a hygroscopic second fluid in order to reduce the volatility of the vehicle and loss through the capsule walls which would result in a drying out of the ink prior to use. For example, to reduce the tendancy of the water to evaporate, ethylene glycol, diethylene glycol, glycerine, propylene glycol, and the like may be mixed with the water.

Typical non-aqueous vehicles include low volatility organics such as dibutyl phthalate, diocytl phthalate, toluene, diphenyl trichloride, benzene, cylclohexane, esters, ketones, paraffins and the like.

As stated above, the ink may comprise the complete colored image-forming substance or it may be a colored or colorless component of colored image-forming material.

If the ink is the complete colored image substance no further reactions are necessary and the image-receiving layer only needs to be a mordant for the ink. Generally, for aqueous-based inks dyes such as acid and direct dyes are employed. For solvent inks, solvent and vat dyes are employed.

If a two-component ink system is employed, such as a leuco dye system, the leuco dye could be retained in the microcapsules and the reactive component disposed in the mordant layer. If a colorless lactone dye, such as crystal violet is contained in the microcapsules, an acid developer, such as bisphenol-A would be disposed in the mordant layer.

It will be seen that a wide variety of color-forming materials can be employed and that, in the case of two component systems, the disposition of the specific component, either in the microcapsule or the image-receiving element is at the option of the operator.

The microcapsules are inert to the laser radiation and are not affected in any way by the laser radiation. Thus, there is no photosensitive material associated with or retained by the microcapsules. In fact, little if any of the exposing laser radiation will penetrate the barrier layer and even that which does penetrate that layer would have no appreciable effect on the microcapsules, i.e. the capsules are impervious and non-photosensitive as far as the exposing laser is concerned.

Upon rupture of the microcapsules, the ink is substantially uniformly released below the laser-absorptive, ink barrier layer. The barrier layer retains ink in situ behind said layer except in those areas in which the laser has contacted the barrier layer. In those areas, an alteration has occurred in the barrier layer which permits the ink to penetrate therethrough and contact the image-receiving element. Thus, the sensitivity of the imaging process depends solely upon the barrier layer.

The barrier layer is adapted to prevent migration of the ink and is composed of a material which is not soluble or is of sufficiently low solubility in the solvent for the ink. In the areas contacted by the laser, the barrier layer becomes permeable. It is at the areas of laser exposure that the ink from the ruptured capsules migrates through to the image-receiving element.

Visual observation of the barrier layer does not reveal any change in the layer. However, and without intending to be bound by theory, it is believed that the laser has perforated the barrier layer, thereby permitting the passage of the ink below the perforation through to the image-receiving element or that the laser renders the barrier layer sufficiently permeable to permit passage of the ink.

In addition to providing a barrier to the ink, the barrier layer is laser-absorptive. That is, the laser beam does not penetrate the layer but rather is substantially absorbed by the layer, i.e. opaque to the laser. If the layer is not laser-absorptive, the above-described alteration of the layer which permit ink passage does not occur.

The barrier layer is composed of a suitable polymeric material which will substantially absorb at the wavelength of the laser employed. Preferably low melting point resins or thermoplastic polymers are employed. If the polymer is not naturally absorptive at the desired wavelengths, a suitable material must be incorporated therein, such as carbon black or an ultraviolet or infrared absorber to provide the desired degree of absorptivity. It should be understood that the polymer selected, the thickness of the layer and the type and quantity of the added absorber must be selected with regard to the ink so that the migration of the ink in exposed areas will not be impeded or retarded in any way. The barrier layer should also be selected, both with respect to thickness and materials, the provide optimum sensitivity to the laser and optimum dye transfer time at the exposed areas.

As examples of suitable polymers for use in the barrier layer, mention may be made of polyvinyl alcohol in the case of a solvent vehicle for the ink, or a wax in the case of an aqueous vehicle for the ink.

The image-receiving element comprises a support and a mordant layer adapted to receive and retain the ink migrating thereto. The particular image-receiving layer is generally polymeric in nature and is selected with regard to the particular ink employed.

The supports employed in the present invention are not critical. The supports employed may comprise any of the various types of rigid or flexible supports. For example, glass, polymeric films of both the synthetic type and those derived from natural occurring products, including paper, may be employed. If a transparency is desired, the image-receiving element employs a transparent support; if a reflection print is desired, an opaque support is employed. The support for the imaging element may be either opaque or transparent. Especially suitable materials comprise flexible transparent synthetic polymers such as polymethylacrylic acid, methyl and ethyl esters; vinyl chloride polymers; polyvinyl acetals; polyamides such as nylon; polyesters such as the polymeric films derived from ethylene glycol terephthalic acid; polymeric cellulose derivatives such as cellulose acetate propionate; polycarbonates; polystyrenes and the like. If a porous support, such as paper, is employed as the support for the imaging element, care should be taken to avoid too gret a competition for the ink which could result in too little migrating to the image-receiving element.

Turning now to the drawings, FIG. 1 is a cross-sectional view of imaging element 10 in the exposure mode. The imaging element comprises support 12 carrying a layer of microcapsules 14 which microcapsules retin an ink therein. Over the layer of microcapsules is a laser absorptive ink barrier layer 16. As shown in FIG. 1, laser 20 from source 18 impinges on layer 16 altering the permeability characteristics of layer 16 in area 21 contacted by laser 20.

Figure 2:
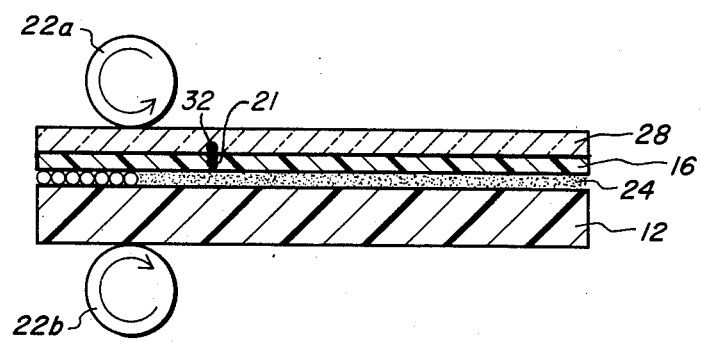
FIG. 2 is a cross-sectional view of the imaging element of FIG. 1 shown with a superposed image-receiving layer in the development mode.

FIG. 2 is a cross-sectional view of the element of FIG. 1 in the development mode. Support 12 carries layer 24 which now comprises ruptured capsules and the ink released therefrom as a result of passage between rollers 22a and 22b. Image-receiving element 28 is superposed over layer 16 to receive the ink diffusing through layer 16 at area 21 as a result of laser imaging to point 32 on imaging-receiving element 28.

For convenience, the invention has been described in terms of a single color. It should be understood, however, that the present invention may be employed to form multicolor continuous tone images. To form a multicolor image, at least a first and second imaging element, containing a different colored encapsulated ink would be successively exposed to laser imaging. Each element would then be processed as described above registered with a single receiver sheet. Thus, by means of the present invention, multicolored images with any desired number of colors may be prepared.

What is claimed is:

1. An imaging element consisting essentially of a support carrying on the first surface, in sequence, a layer of microcapsules containing an ink, and a laser-absorpitve, ink barrier layer, said barrier layer adapted to permit ink to penetrate therethrough upon contact with an exposing laser beam.

2. The product of claim 1 wherein said laser-absorptive, ink barrier layer comprises a low-melting resin.

3. The product of claim 1 wherein said laser-absorptive, ink barrier layer comprises a thermoplastic polymer.

4. The product of claim 3 wherein said polymer is polyvinyl alcohol.

5. The product of claim 1 wherein said laser-absorptive, ink barrier layer contains carbon black.

6. The product of claim 1 wherein said laser-absorptive, ink barrier layer contains an infrared absorber.

7. The product of claim 1 wherein said laser-absorptive, ink barrier layer contains an ultraviolet absorber 8. The product of claim 1 wherein said microcapsules range from about 1 to about 100 micrometers.

9. The product of claim 1 wherein said ink is nonaqueous.

10. The product of claim 1 wherein said ink is aqueous.

11. The product of claim 1 wherein said ink contains a pigment.

12. The product of claim 1 wherein said ink contains a dye.

13. The product of claim 1 wherein said ink contains a color precursor.

14. A method for forming an image which comprises imagewise exposing an imaging element with a laser, said imaging element consisting essentially of a support carrying on a first surface, in sequence, a layer of microcapsules containing an ink, and a laser-absorptive, ink barrier layer; said laser exposure altering said barrier layer in the areas of exposure to permit ink to penetrate therethrough; superposing an image-receiving element adapted to receive ink from said microcapsules over said imaging element and rupturing said microcapsules whereby ink from said microcapsules diffuses to said superposed receiving element forming an image corresponding to the laser exposure.

15. The method of claim 14 wherein said image-receiving element comprises a support carrying an image-receiving layer for said ink.

16. The method of claim 15 wherein said image-receiving element support is transparent.

17. The method of claim 15 wherein said image-receiving element support is opaque.

18. The method of claim 14 wherein said laser-absorptive, ink barrier layer comprises a low-melting resin.

19. The method of claim 14 wherein said laser-absorptive, ink barrier layer comprises a thermoplastic polymer.

20. The method of claim 19 wherein said polymer is polyvinyl alcohol.

21. The method of claim 14 wherein said laser-absorptive, ink barrier layer contains carbon black.

22. The method of claim 14 wherein said laser-absorptive, ink barrier layer contains an infrared absorber.

23. The method of claim 14 wherein said laser-absorptive, ink barrier layer contains an ultraviolet absorber.

24. The method of claim 14 wherein said ink is nonaqueous.

25. The method of claim 14 wherein said ink is aqueous.

26. The method of claim 14 wherein said ink contains a pigment.

27. The method of claim 14 wherein said ink contains a dye.

28. The method of claim 14 wherein said ink contains a collor precursor.

29. The method of claim 14 wherein said ink comprises a first color-forming substance and said image-receiving element contains a second color forming substance; said first and second color forming substance adapted to co-react to form a colored substance in said image-receiving layer.

30. The method of claim 29 wherein said ink is a colorless lactone dye and an acid developer is retained in said image-receiving element.

31. The method of claim 14 wherein said capsules are ruptured by passing said imaging element and said image-receiving element between pressure applying rollers.

* * * * *